US006534224B2

(12) United States Patent
Lukanc

(10) Patent No.: US 6,534,224 B2
(45) Date of Patent: Mar. 18, 2003

(54) PHASE SHIFT MASK AND SYSTEM AND METHOD FOR MAKING THE SAME

(75) Inventor: Todd Lukanc, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 172 days.

(21) Appl. No.: 09/772,577

(22) Filed: Jan. 30, 2001

(65) Prior Publication Data

US 2002/0102471 A1 Aug. 1, 2002

(51) Int. Cl.[7] .............................. G03F 9/00; G06F 17/50
(52) U.S. Cl. ............................................. 430/5; 716/19
(58) Field of Search ............................. 430/5, 296, 30; 716/19, 20

(56) References Cited

U.S. PATENT DOCUMENTS

| | | | | |
|---|---|---|---|---|
| 5,573,890 A | | 11/1996 | Spence | 430/5 |
| 5,686,208 A | * | 11/1997 | Le et al. | 430/5 |
| 5,702,848 A | | 12/1997 | Spence | 430/5 |
| 5,766,804 A | | 6/1998 | Spence | 430/5 |
| 5,766,806 A | | 6/1998 | Spence | 430/5 |
| 5,858,580 A | | 1/1999 | Wang et al. | 430/5 |

OTHER PUBLICATIONS

U.S. patent application entitled "Method of Extending the Areas of Clear Field Phase Shift Generation", Ser. No. 10/016,439 filed on Dec. 11, 2001. (Related Application).
U.S. patent application entitled "Method of Enhancing Clear Field Phase Shift Masks with Border Around Edges of Phase Regions", Ser. No. 10/016,441 filed on Dec. 11, 2001. (Related Application).
Waas, Eisenmann, Hartmann, and Henke, *Automatic Generation of Phase Shift Mask Layouts*, Microelectronic Engineering, vol. 23, Jan. 1994, pp. 140–142.

Kazuku Ooi, Shigehiro Hara and Kiyomi Koyama, *Computer Aided Design Software for Designing Phase–Shifting Masks*, Japanese Journal of Applied Physics, vol. 32, Pt. 1, No. 12B, 1993, pp. 5887–5891.

Akemi Moniwa, Tsuneo Terasawa, Norio Hasegawa and Shinji Okazaki, *Algorithm for Phase–Shift Mask Design with Priority on Shifter Placement*, Japanese Journal of Applied Physics, vol. 32, Pt. 1, No. 12B, 1993, pp. 5874–5879.

Jinbo, Hidoyuki and Yamashita, Yoshio; *0.2μm or Less i–Line Litohgraphy by Phase–Shifting–Mask Technology*, 1990 International Electron Devices Meeting, Technical Digest, IEEE, San Francisco, CA, Dec. 9–12, 1990, pp. 33.3.1–33.3.4.

U.S. patent application entitled "*Method of Enhancing Clear Field Phase Shift Masks With Border Regions Around Phase 0 and Phase 180 Regions*", Ser. No. 10/016,273 filed on Dec. 11, 2001. (Related Application).

U.S. patent application entitled "*Method of Enhancing Clear Field Phase Shift Masks by Adding Parallel Line to Phase 0 Region*"; Ser. No. 10/016,702 filed on Dec. 11, 2001. (Related Application).

(List continued on next page.)

*Primary Examiner*—S. Rosasco
(74) *Attorney, Agent, or Firm*—Renner, Otto, Boisselle & Sklar, LLP

(57) ABSTRACT

A phase shift mask and a system and method for making the same are provided. The phase shift mask comprises a number of phase shifters that define a number of active gate areas. Each of the active gate areas is associated with one of a number of active regions of a predefined circuit. The phase shift mask also includes at least one joined phase shifter defining at least two of the active gate areas. The joined phase shifter extends between at least two of the active regions.

20 Claims, 13 Drawing Sheets

OTHER PUBLICATIONS

U.S. patent application entitled *"Method of Enhancing Clear Field Phase Shift Masks with Chrome Border Around Phase 180 Regions"*, Ser. No. 10/016,710 filed on Dec. 11, 2001. (Related Application).

Levenson et al., "Improving Resolution In Photolithography with a Phase–Shifting Mask," IEEE Transactions on Electron Devices, vol. ED–29, No. 12, Dec. 1982.

Lin, B.J., "Phase–Shifting Masks Gain an Edge," Circuits and Devices, pp. 28–35, Mar. 1993.

* cited by examiner

PHASE SHIFT MASK AND SYSTEM AND METHOD FOR MAKING THE SAME

TECHNICAL FIELD

The present invention is generally related to the field of integrated circuit fabrication and, more particularly, is related to masks employed in the fabrication of integrated circuits.

BACKGROUND OF THE INVENTION

Lithography processing is a required and essential technology when manufacturing conventional integrated circuits. Many lithography techniques exist, and generally all lithography techniques are used for the purpose of defining geometries, features, lines, or shapes onto an integrated circuit die or wafer. In typical lithography, a radiation sensitive material such as photoresist is coated over the top surface of a die or wafer to selectively allow for the formation of the desired geometries, features, lines, or shapes.

One known method of lithography is optical lithography. The optical lithography process generally begins with the formation of a photoresist layer on the top surface of a semiconductor wafer. A mask including light non-transmissive opaque regions and fully light transmissive clear regions is then positioned over the photoresist coated wafer. The light non-transmissive opaque regions are usually formed of chrome and fully light transmissive clear regions are normally formed of quartz.

Light from a visible light source or an ultra-violet light source is then exposed to the mask. In almost all cases, the light is reduced and focused using an optical lens system, which contains one or several lenses, filters, and or mirrors. The light passes through the clear regions of the mask and exposes the underlying photoresist layer. The same light is blocked by the opaque regions of the mask, leaving corresponding underlying portions of the photoresist layer unexposed. The exposed photoresist layer is then developed, typically through chemical removal of the exposed/non-exposed regions of the photoresist layer. The end result is a semiconductor wafer coated with a photoresist layer exhibiting a desired pattern. This pattern can then be used for etching underlying regions of the wafer.

Since the first integrated circuits where created, the electronics industry has been driven to increase the number of transistors on a given size wafer. As a consequence, integrated circuit designers continue to design circuits with smaller minimum dimensions. However, prior to the work of Levenson, et. al., as reported in "Improving Resolution in Photolithography with a Phase Shifting Mask," IEEE Transactions on Electron Devices, VOL., ED-29, November 12, December 1982, pp. 1828–1836, it was found that the traditional optical lithography process placed real limits on the minimum realizable dimension due to diffraction effects. Specifically, at integrated circuit design feature sizes of 0.5 microns or less, the best resolution has demanded a maximum obtainable numerical aperture (NA) of the lens systems. However, since the depth of field of the lens system is inversely proportional to the NA and the surface of the integrated circuit could not be optically flat, good focus could not be obtained when good resolution was obtained and vice versa. Consequently, as the minimum realizable dimension is reduced in manufacturing processes for semiconductors, the limits of optical lithography technology are being reached. In particular, as the minimum dimension approaches 0.1 microns, traditional optical lithography techniques will not work effectively.

With the desire of breaking through this minimum size barrier, one technique which has been developed as described by Levenson, et. al. is called phase shifting. In phase shifting, the destructive interference caused by two adjacent clear areas in an optical lithography mask is used to create an unexposed area on the photoresist layer. This is accomplished by making use of the fact that light passing through clear regions on a mask exhibits a wave characteristic such that the phase of the amplitude of the light exiting from the mask material is a function of the distance the light travels in the mask material. This distance is equal to the thickness of the mask material. By placing two clear areas adjacent to each other on a mask, one of thickness $t_1$ and the other of thickness $t_2$, one can obtain a desired unexposed area on the photoresist layer through interference. In particular, by specifying the thickness $t_2$ such that $(n-1)(t_2)$ is exactly equal to $\frac{1}{2}\lambda$, where $\lambda$ is the wavelength of the light shining through the mask material and n is the refractive index of the material of thickness $t_1$, the amplitude of the light exiting the material of thickness $t_2$ is 180 degrees out of phase with the light exiting the material of thickness $t_1$. Since the photoresist material is responsive to the intensity of the light and the opposite phases of light cancel where they overlap, a dark unexposed area will be formed on the photoresist layer at the point between the two clear regions of differing thicknesses. Phase shifting masks are well known and have been employed in various configurations as set out by B. J. Lin in the article, "Phase-Shifting Masks Gain an Edge," Circuits and Devices, March 1993, pp. 28–35. The configuration described above has been called phase shift masking (PSM). In comparing the various phase shifting configurations, researchers have shown that the PSM method can achieve dimension resolution of 0.25 microns and lower.

Currently, phase shifting algorithms employed to design phase shift masks used according to the foregoing principles typically define a phase shifting area that extends just beyond active regions of an active layer. The remaining length of polysilicon, for example, is typically defined by a field mask. However, this approach is not without its problems. Specifically, alignment offsets between phase shift masks and field masks may result in kinks or pinched regions in the polysilicon lines as they transition from the phase shifting area to the field mask areas. Also, since the field masks are employed to print the dense, narrow lines of polysilicon beyond the active regions, the field masks become as critical and exacting as the phase shift masks.

SUMMARY OF THE INVENTION

In light of the forgoing, the present invention provides for a phase shift mask and a system and method for making the same. In one embodiment, the phase shift mask comprises a number of phase shifters that define a number of active gate areas. Each of the active gate areas is associated with one of a number of active regions of a predefined circuit. The phase shift mask also includes at least one joined phase shifter defining at least two of the active gate areas. The at least one joined phase shifter extends between at least two of the active regions.

This phase shift mask provides several advantages such as, for example, that the phase shift mask defines the polygons of polysilicon both in locations overlapping and between the active regions of a predefined circuit design. Thus, a field mask is not needed to define the polygons between the active regions. This minimizes any error introduced by the fact that both a phase shift mask and a field mask are employed to define the polygons as in the prior art.

In another embodiment, the present invention provides method for designing a phase shift mask. The present method includes the step of defining a number of phase shift regions that further define a number of active gate areas, where each of the active gate areas is associated with one of a number of active regions of a predefined circuit. The method also includes the step of defining a number of phase shifters by assigning a phase to each of the phase shift regions. The method further includes the step of defining a joined phase shifter by joining at least two of the phase shifters, where the two phase shifters are associated with different ones of the active regions and the phase shifters have the same phase assigned thereto.

In addition, the present invention also provides for a computer program embodied on a computer readable medium for designing a phase shift mask. The computer program includes logic to logic to define a number of phase shift regions that further define a number of active gate areas, where each of the active gate areas is associated with one of a number of active regions of a predefined circuit. The computer program also includes logic to define a number of phase shifters by assigning a phase to each of the phase shift regions, and, logic to define a joined phase shifter by joining at least two of the phase shifters, the two phase shifters being associated with different ones of the active regions, and the two of the phase shifters having a same phase assigned thereto.

Other features and advantages of the present invention will become apparent to a person with ordinary skill in the art in view of the following drawings and detailed description. It is intended that all such additional features and advantages be included herein within the scope of the present invention.

BRIEF DESCRIPTION OF THE DRAWINGS

The invention can be understood with reference to the following drawings. The components in the drawings are not necessarily to scale. Also, in the drawings, like reference numerals designate corresponding parts throughout the several views.

DETAILED DESCRIPTION OF THE INVENTION

Figure 1:
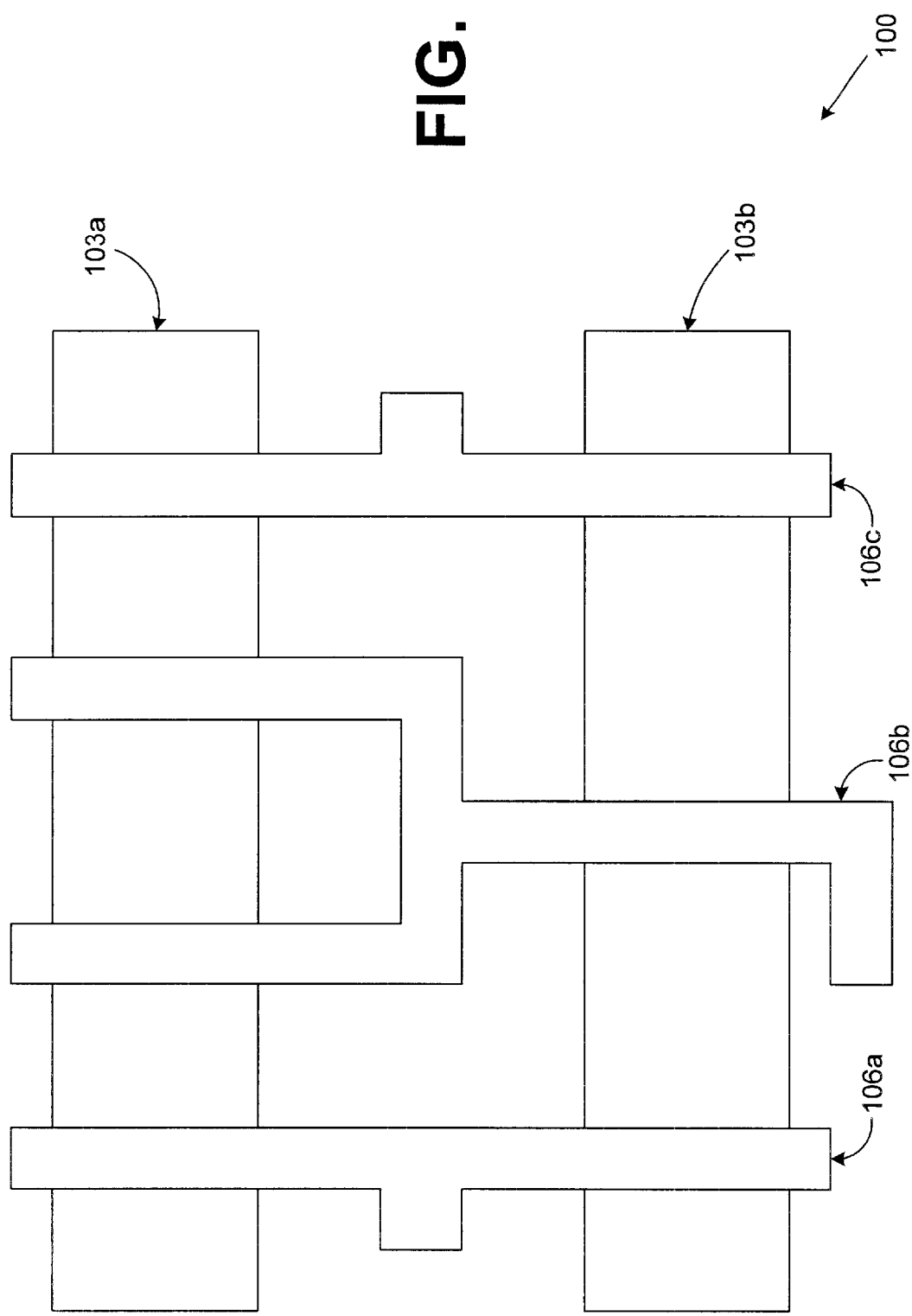
FIG. 1 is a plan view of an integrated circuit structure having active regions in an active layer with polysilicon polygons placed thereon.

With reference to FIG. 1, shown is a plan view of a predefined integrated circuit design 100 that serves as an example to illustrate the creation of a phase shift mask according to an aspect of the present invention. The predefined integrated circuit design 100 includes active regions 103a and 103b and polygons 106a, 106b, and 106c of polysilicon. The active regions 103a and 103b may be part of an active layer that is created, for example, by doping an amount of silicon in the form of the active regions 103a and 103b encompassed within the active layer. The polygons 106a-c act as conductors as is generally understood by those with ordinary skill in the art.

The segments or portions of the polygons 106a-c that overlap with the active regions 103a and 103b form the active gate areas of transistors. These segments of the polygons 106a-c are often referred to as "active polysilicon" or "active poly". The remaining segments or portions of the polygons 106a-c that do not overlap with any of the active regions 103a and 103b are often referred to as "field poly." The polygons 106a-c are representative of the various types of circuit elements that may be created in an integrated circuit as is generally known by those with ordinary skill in the art. In order to create the polygons 106a-c, a phase shift mask is employed as will be discussed. Using the integrated circuit design 100 as an example, next the various steps involved in designing a phase shift mask to create the actual integrated circuit from the integrated circuit design 100 are discussed with reference to later Figures.

Figure 2:
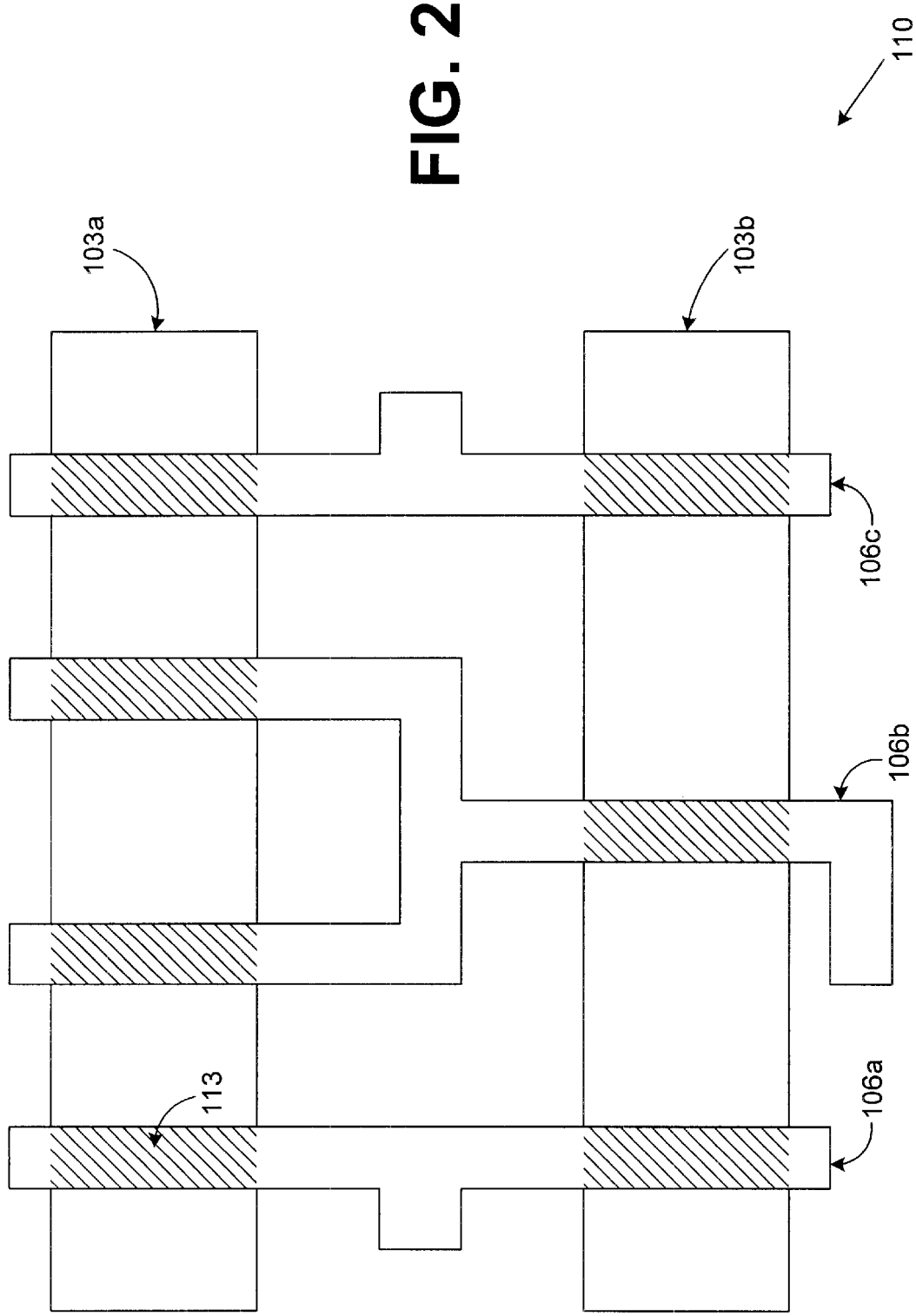
FIG. 2 is a plan view of the integrated circuit structure of FIG. 1 further identifying active gate areas.

Referring then to FIG. 2, shown is a plan view of an integrated circuit design that illustrates a first step 110 in creating a phase shift mask with which to produce the exemplary integrated circuit design 100 according to an aspect of the present invention. In the first step 110, the active gate areas 113 of the polygons 106a-c are identified. The active gate areas 113 are identified by locating the "active poly" that exists where there is an overlap of any of the polygons 106a-c with the active regions 103a and 103b.

Figure 3:
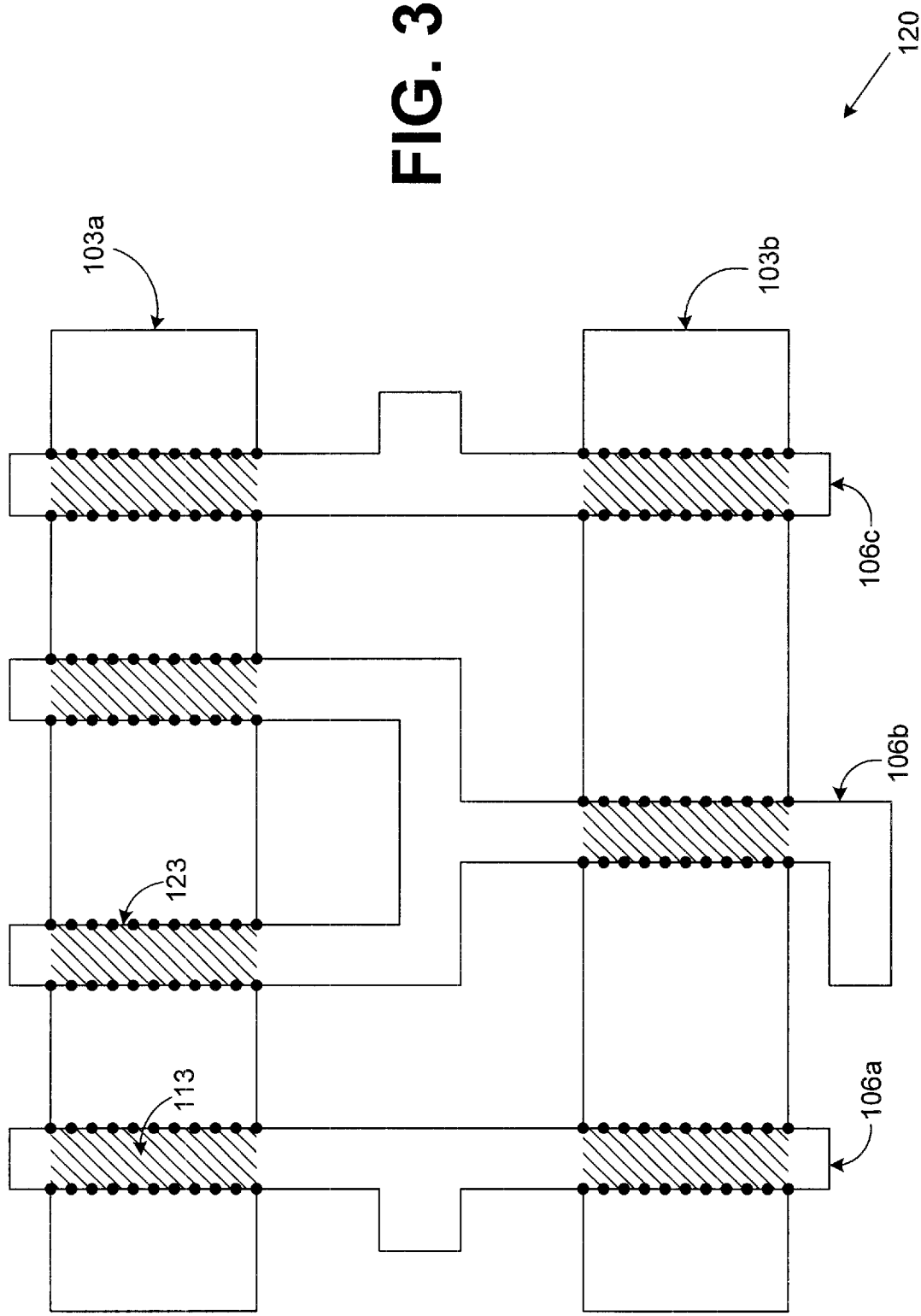
FIG. 3 is a plan view of the integrated circuit structure of FIG. 2 further identifying edges of the active gate areas.

With reference to FIG. 3, shown is a plan view of the integrated circuit design that illustrates a second step 120 in creating a phase shift mask in which the edges 123 of the active gate areas 113 are identified. The edges 123 are defined as the edges of the portions of the polygons 106a-c that overlap with the active regions 103a and 103b. The edges 123 of the active gate areas 113 are denoted with dots as shown in FIG. 3.

Figure 4:
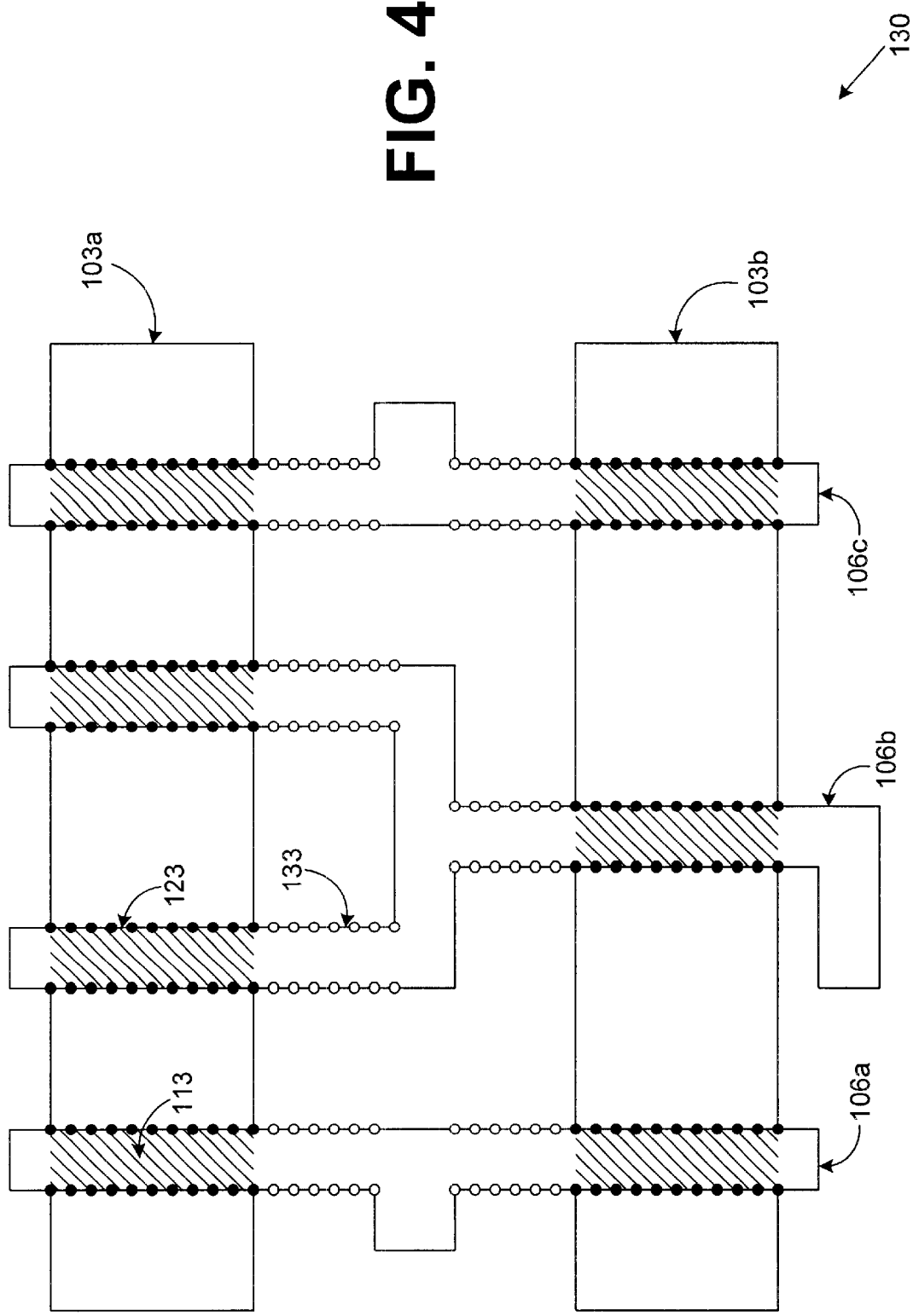
FIG. 4 is a plan view of the integrated circuit structure of FIG. 3 further identifying straight edges of polysilicon polygons that extend directly from the edges of the active gate areas.

Turning to FIG. 4, shown is a plan view of an integrated circuit design illustrating a third step 130 in the design of a phase shift mask. In this step, a number of straight edges 133 of the polygons 106a-c extending directly from the edges 123 of the active gate areas 113 are identified. Note that the straight edges 133 are denoted in FIG. 4 with hollow dots as shown.

Figure 5:
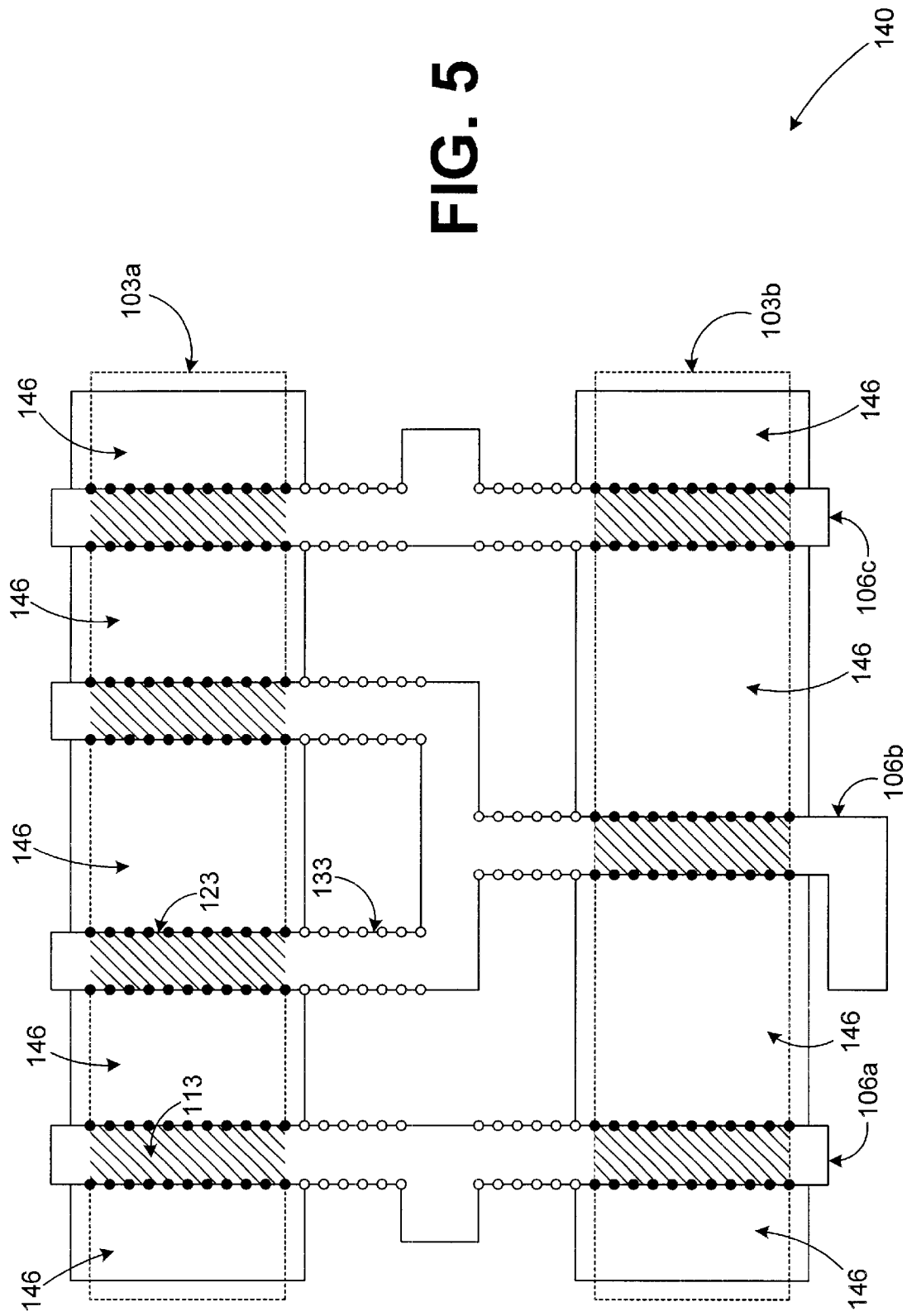
FIG. 5 is a plan view of the integrated circuit structure of FIG. 4 further identifying phase shift regions that extend just beyond the active regions.

Referring to FIG. 5, shown is a plan view of an integrated circuit design that illustrates a fourth step 140 in creating a phase shift mask. In the fourth step 140 a number of phase shift regions 146 on either side of the active gate areas 113 are identified. The phase shift regions 146 are created by defining a rectangle that extends from the edges 123 of the polygons 106a-c by a predetermined phase width. Thereafter, the edges of the phase shift regions 146 that do not border with the polygons 106a-c are extended just beyond the active regions 103a and 103b. Any two of the phase shift regions 146 defined in this manner that overlap are joined. Also, any two of the phase shift regions 146 that are separated by a predetermined minimum gap are joined as well. As shown with reference to FIG. 5, all relevant of the phase shift regions 146 were either overlapping or separated by the predetermined minimum gap and are joined. Note that the predetermined phase width and minimum gap are ascertained based on the characteristics of the light to pass through the resulting phase shift mask as well as other factors as is generally understood by those with ordinary skill in the art.

Figure 6:
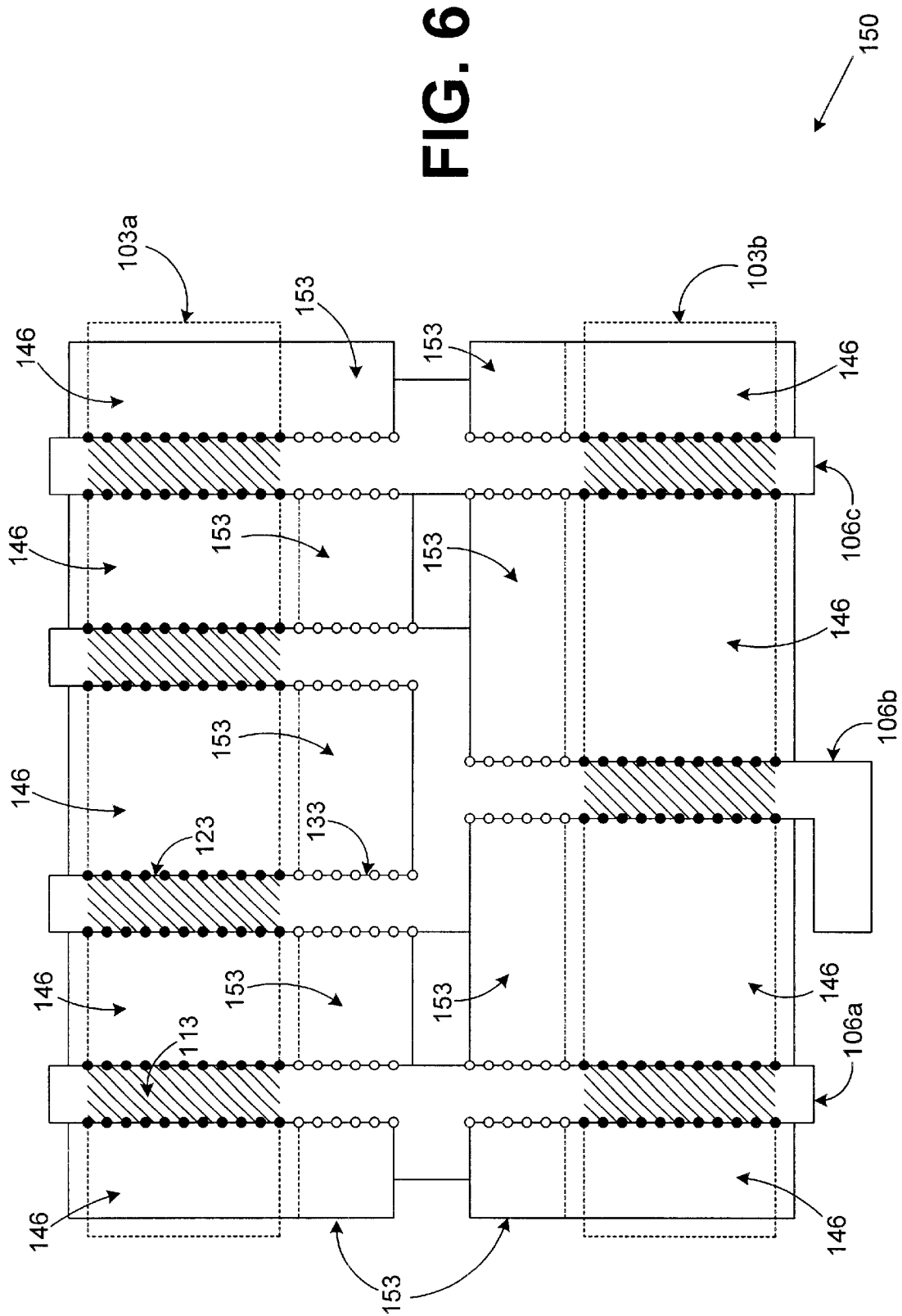
FIG. 6 is a plan view of the integrated circuit structure of FIG. 5 in which the phase shift regions have been extended beyond the active regions along the straight edges of the polysilicon polygons.

With reference to FIG. 6, shown is a plan view of an integrated circuit design that illustrates a fifth step 150 in creating a phase shift mask. In the fifth step 150, a number of first phase shift expansions 153 are identified that extend from the phase shift regions 146 along the straight edges 133. The first phase shift expansions 153 are then included as a portion of the phase shift regions 146.

Figure 7:
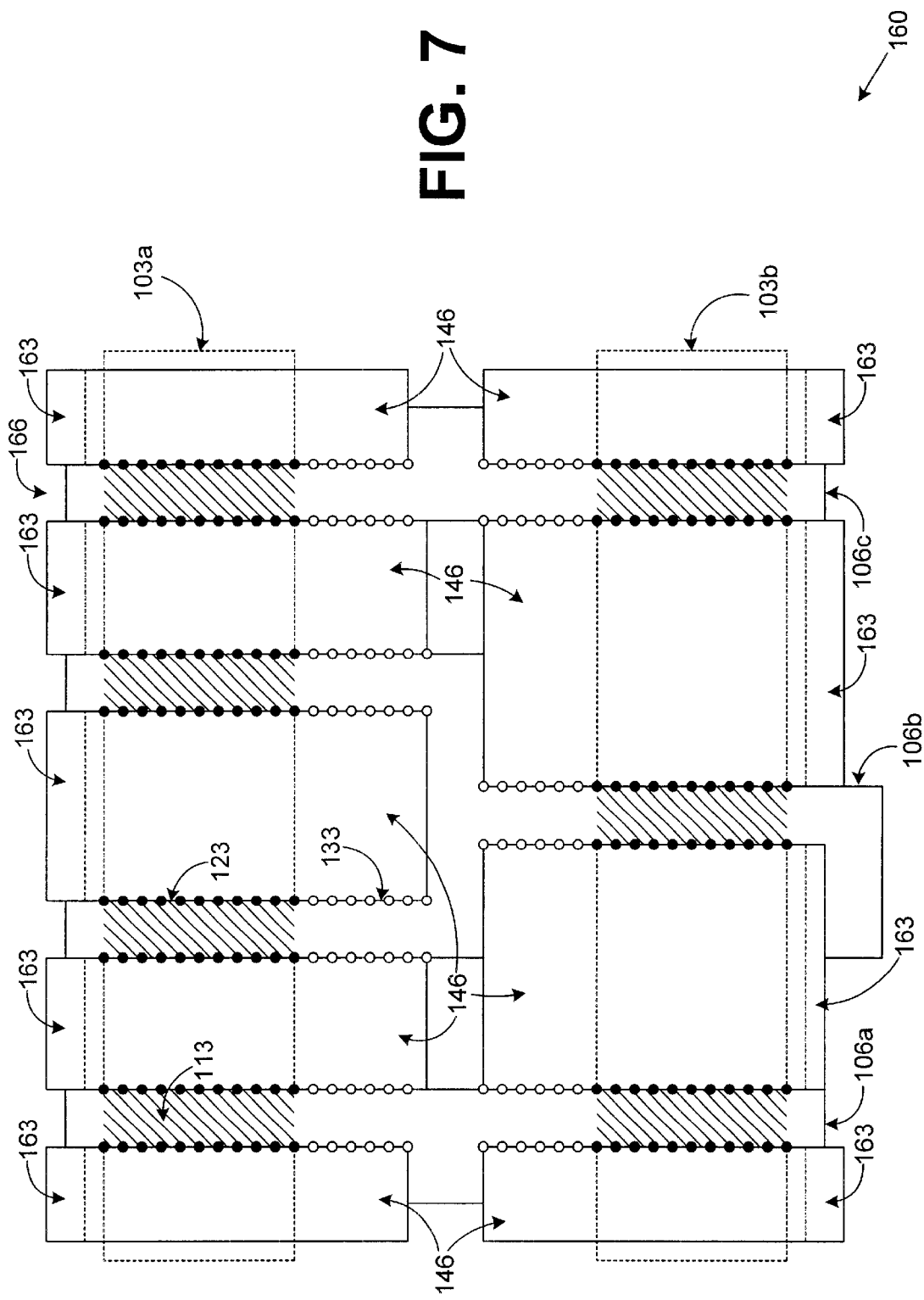
FIG. 7 is a plan view of the integrated circuit structure of FIG. 6 in which the phase shift regions have been extended beyond the endcaps of selected polysilicon polygons.

Turning to FIG. 7, shown is a plan view of an integrated circuit design that illustrates a sixth step 160 in designing a phase shift mask. In the sixth step 160, a number of second phase shift expansions 163 extending from the phase shift regions 146 beyond the end caps 166 of the polygons 106a-c are identified. The second phase shift expansions 163 are then included as a portion of the phase shift regions 146.

Figure 8:
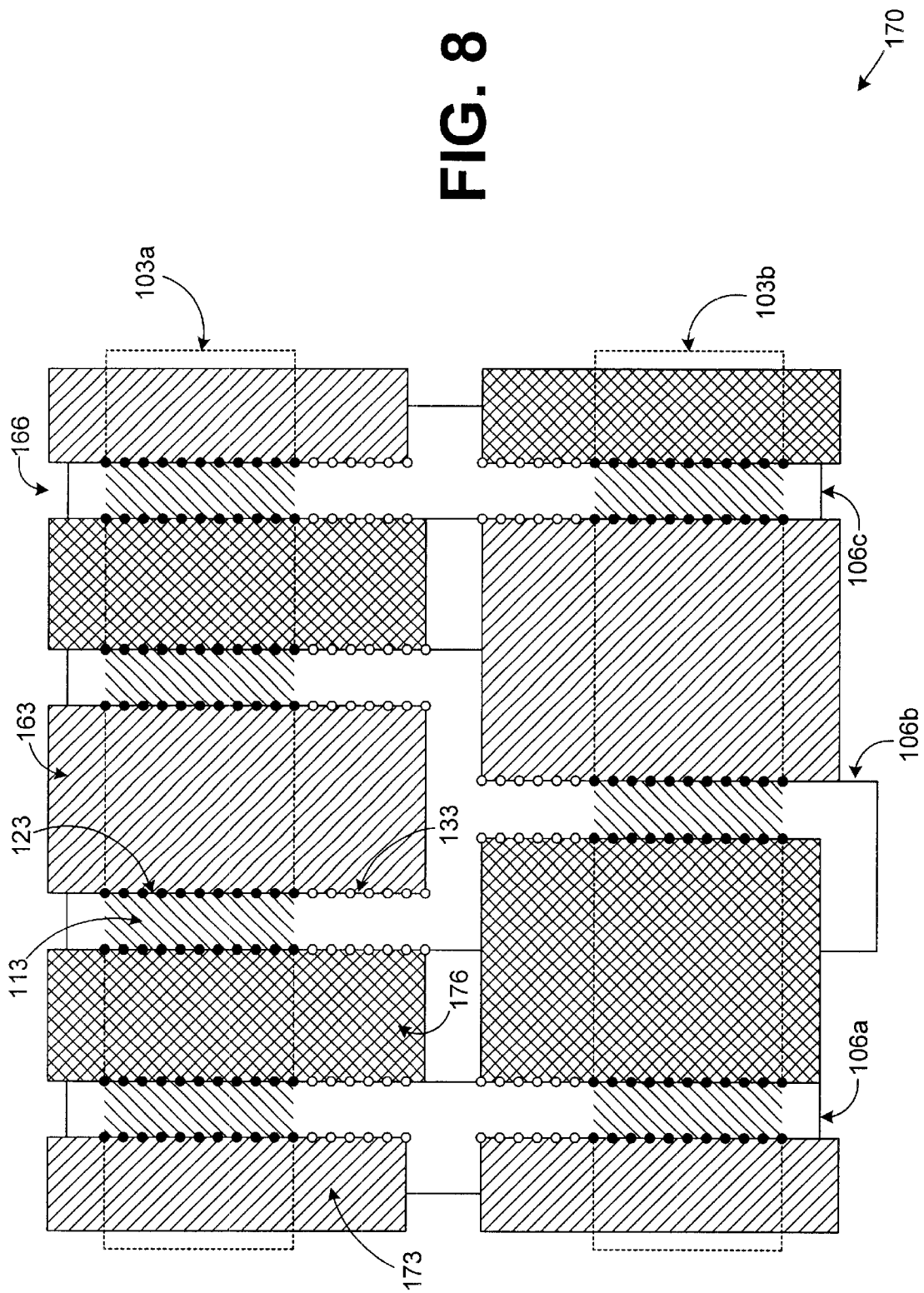
FIG. 8 is a plan view of the integrated circuit structure of FIG. 7 in which a phase is assigned to each of the phase shift regions, thereby resulting in phase shifters.

Referring then, to FIG. 8, shown is a plan view of an integrated circuit design that illustrates a seventh step 170 in designing a phase shift mask. In the seventh step 170, the phase shift regions 146 (FIG. 7) are "colored" with a particular phase, resulting in first and second phase shifters 173 and 176. The phase shifters 173 and 176 cause a predetermined shift in the phase of light passing therethrough. For example, the first phase shifters 173 may be designed to create a zero degree phase shift and the second phase shifters 176 may be designed to create a 180 degree phase shift. This combination causes a desired destructive interference that allows the creation of the active gate areas 113 with great precision as is generally known by those with ordinary skill in the art. Alternatively, other phase shifts may be created that provide desired effects.

Generally, the phase shift regions 146 that are associated with a specific active region 103a or 103b are colored in an alternating fashion. Specifically, the phase shifters 173 and 176 alternate so that different phase shifters lie on opposite sides of the gate shift areas 113. Note that the particular order of the phases assigned to the phase shift regions 146 may be determined in one of a number of different ways. For example, a starting phase may be assigned to a left most phase shift region 146 and the remaining phase shifters 173 and 176 alternate relative thereto.

Figure 9:
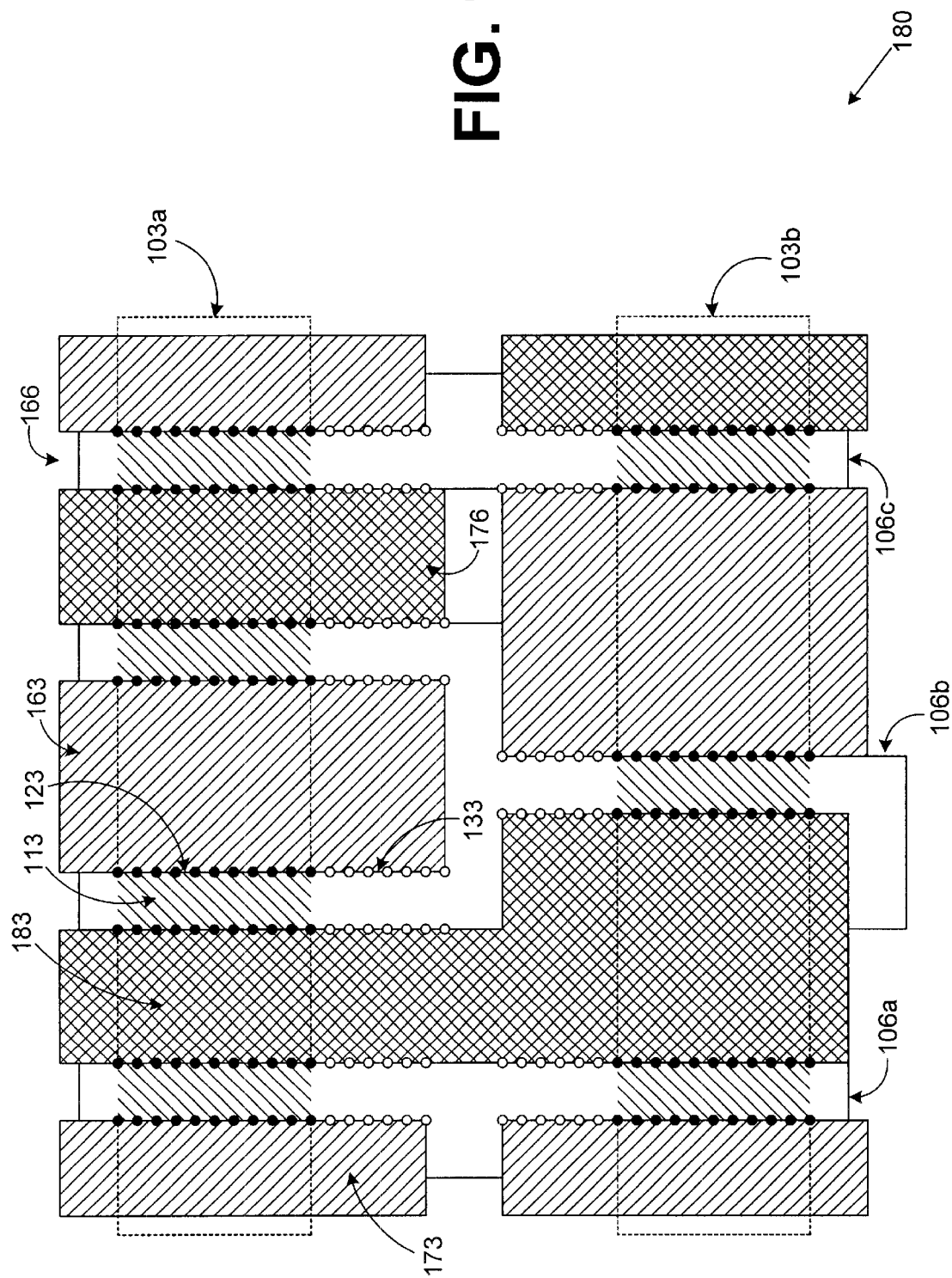
FIG. 9 is a plan view of the integrated circuit structure of FIG. 8 in which phase shifters located over different active regions and that are separated by an undefined region are joined.

With reference to FIG. 9, shown is a plan view of an integrated circuit design that illustrates an eighth step 180 in designing a phase shift mask. In the eighth step 180, corresponding phase shifters 173, 176 that are associated with different active regions 103a and 103b that have the same phase and are separated by an undefined region are joined into a joined phase shifter 183. The joined phase shifter 183 thus extends across both active regions 103a and 103b. This step advantageously eliminates the necessity of using a field mask to form the segments of the polygons 106a-c that are between the active regions 103a and 103b wherever two phase shifters 173, 176 may be joined.

Figure 10:
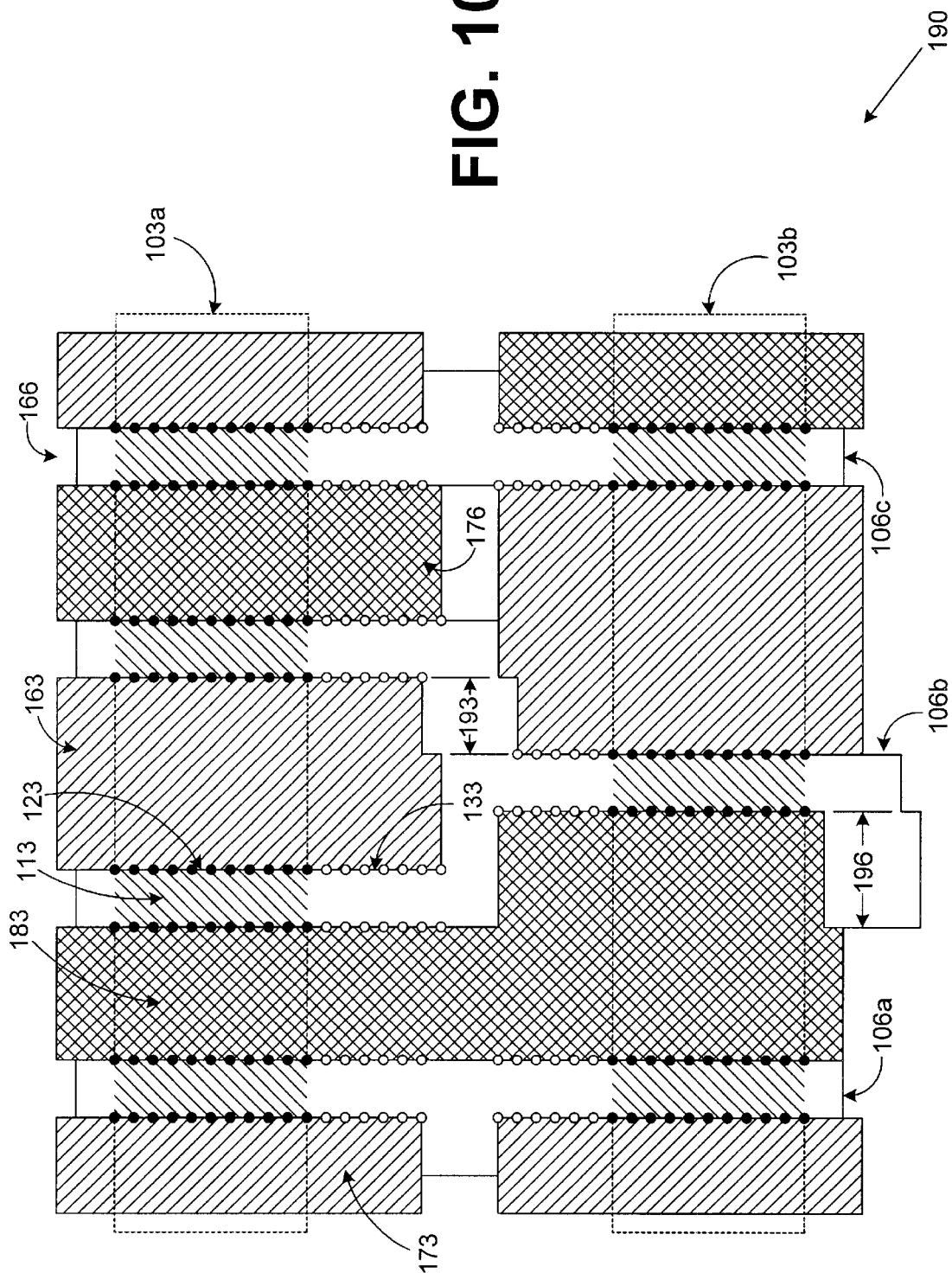
FIG. 10 is a plan view of the integrated circuit structure of FIG. 8 in which segments of the polysilicon polygons are widened.

With reference to FIG. 10, shown is a plan view of an integrated circuit design that illustrates a ninth step 190 employed to design a phase shift mask. In the ninth step 190, segments of the polygons 106a-c are identified that are surrounded on both sides by phase shifters 173, 176 that have the same phase. Such segments are widened so as to become "widened segments" 193. In a similar manner, all segments of the polygons 106a-c are identified that are bounded on one side by a phase shifter 173, 176, or 183 and on the other side by undefined area that is exposed using a field mask as is generally known by those with ordinary skill in the art. Such segments become widened segments 196. The widened segments 193 and 196 are widened to make sure that they are not compromised in their width due to the phase shift masks and field masks. Specifically, the proximity of the phase shift masks and field masks in such a manner may create constructive interference that may detrimentally effect the shape of the polygons 106a-c. Thus, the discussion with reference to FIGS. 2–10 provides the various steps that are involved to design and create a phase shift mask with the phase shift regions 173, 176, and 183 shown with respect to FIG. 10.

Figure 11:
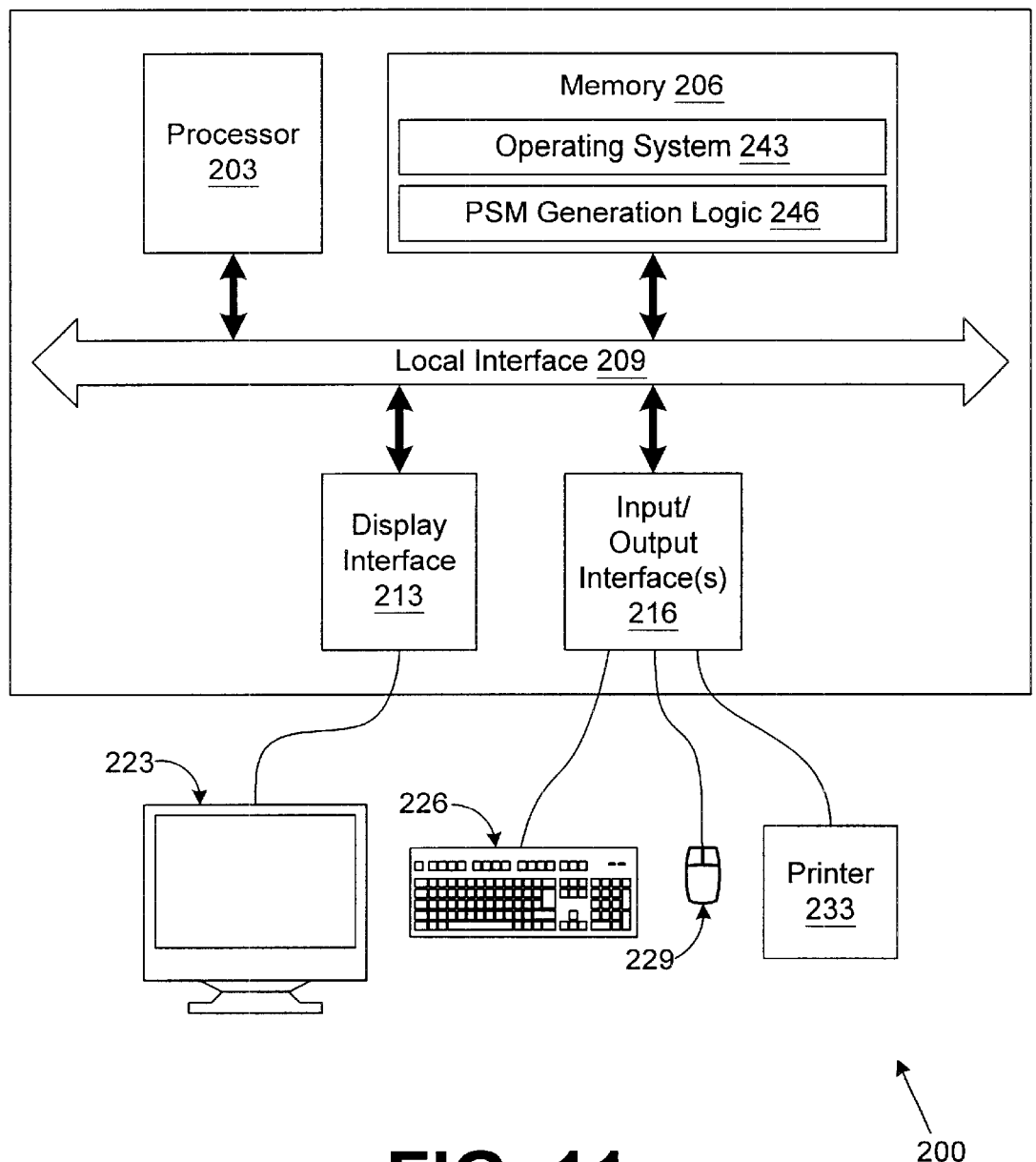
FIG. 11 is a block diagram of a phase shift mask generation system according to an aspect of the present invention.

With this in mind, reference is made to FIG. 11 that shows a block diagram of a phase shift mask (PSM) generation system 200, according to an embodiment of the present invention. The PSM generation system 200 includes a processor circuit with a processor 203 and a memory 206, both of which are coupled to a local interface 209. The local interface 209 may be, for example, a data bus with an accompanying control-bus as is generally understood by those with ordinary skill in the art. Thus, the PSM generation system 200 may be, for example, a computer system or other system with similar capability. The PSM generation system 200 also includes a display interface 213 and various input/output interfaces 216 that link the local interface 209 to various peripheral devices.

The peripheral devices that may accompany the PSM generation system 200 include, for example, a display device 223, a keyboard 226, a mouse 229, or a printer 233. The display device 223 is coupled to the local interface 209 through the display interface 213. Likewise, the keyboard 226, mouse 229, and printer 233 are coupled to the local interface 209 through the input/output interfaces 216. The display interface 213 and input/output interfaces 216 may compromise, for example, interface cards or other such devices. In addition, other peripheral devices that may be employed with the PSM generation system 200 may include, for example, various user input devices such as a keypad, touch pad, touch screen, microphone, scanner, joystick, or one or more push buttons, etc. Likewise, user output devices may include indicator lights, speakers, etc. The display device 223 may be, for example, cathode ray tubes (CRT), a liquid crystal display screens, a gas plasma-based flat panel displays, light emitting diodes, etc.

Stored on the memory 206 and executable by the processor 203 is an operating system 243 and PSM generation logic 246 according to an aspect of the present invention. The operating system 243 controls the general functions of the PSM generation system 200 as is generally known by those with ordinary skill in the art. Consequently, the operation of the operating system 243 is not discussed in detail herein. The PSM generation logic 246 is executed by the processor 203 in order to design a phase shift mask according to the principles discussed with reference to FIGS. 1–10.

The memory 206 may include both volatile and nonvolatile memory components. Volatile components are those that do not retain data values upon loss of power. Nonvolatile components are those that retain data upon a loss of power. Thus, the memory 206 may comprise, for example, random access memory (RAM), read-only memory (ROM), hard disk drives, floppy disks accessed via an associated floppy disk drive, compact disks accessed via a compact disk drive, magnetic tapes accessed via an appropriate tape drive, and/or other memory components, or a combination of any two or more of these memory components.

In addition, the processor 203 may represent multiple processors and the memory 206 may represent multiple memories that operate in parallel. In such a case, the local interface 209 may be an appropriate network that facilitates communication between any two of the multiple processors or between any processor and any of the memories, etc. The local interface 209 may facilitate memory to memory communication as well. The processor 203, memory 206, and local interface 209 may be electrical or optical in nature. Also, the memory 206 may be magnetic in nature.

Figure 12A:
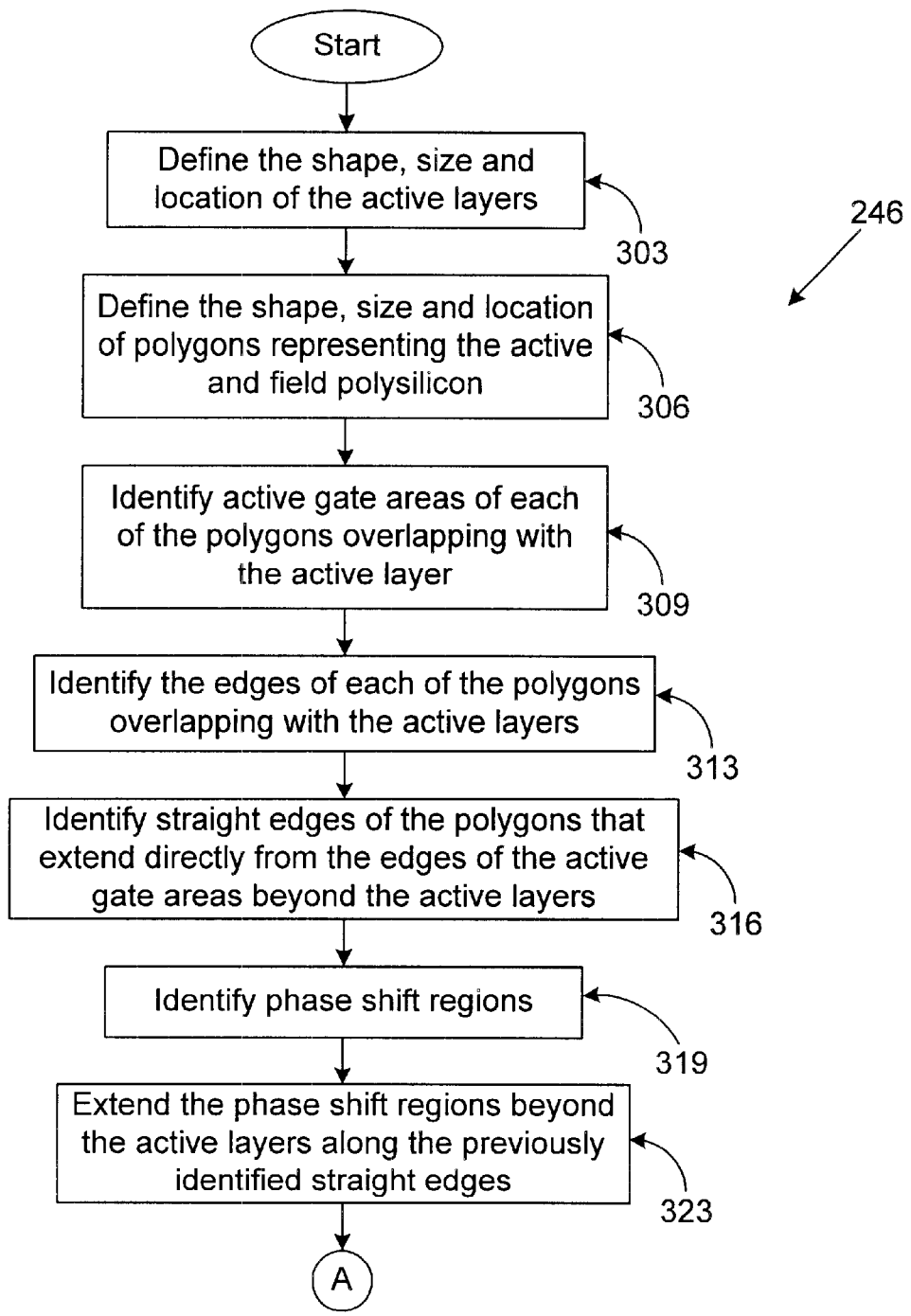
FIGS. 12A and 12B depict a flow chart of phase shift mask design logic executed, for example, in the phase shift mask generation system of FIG. 11.
Figure 12B:
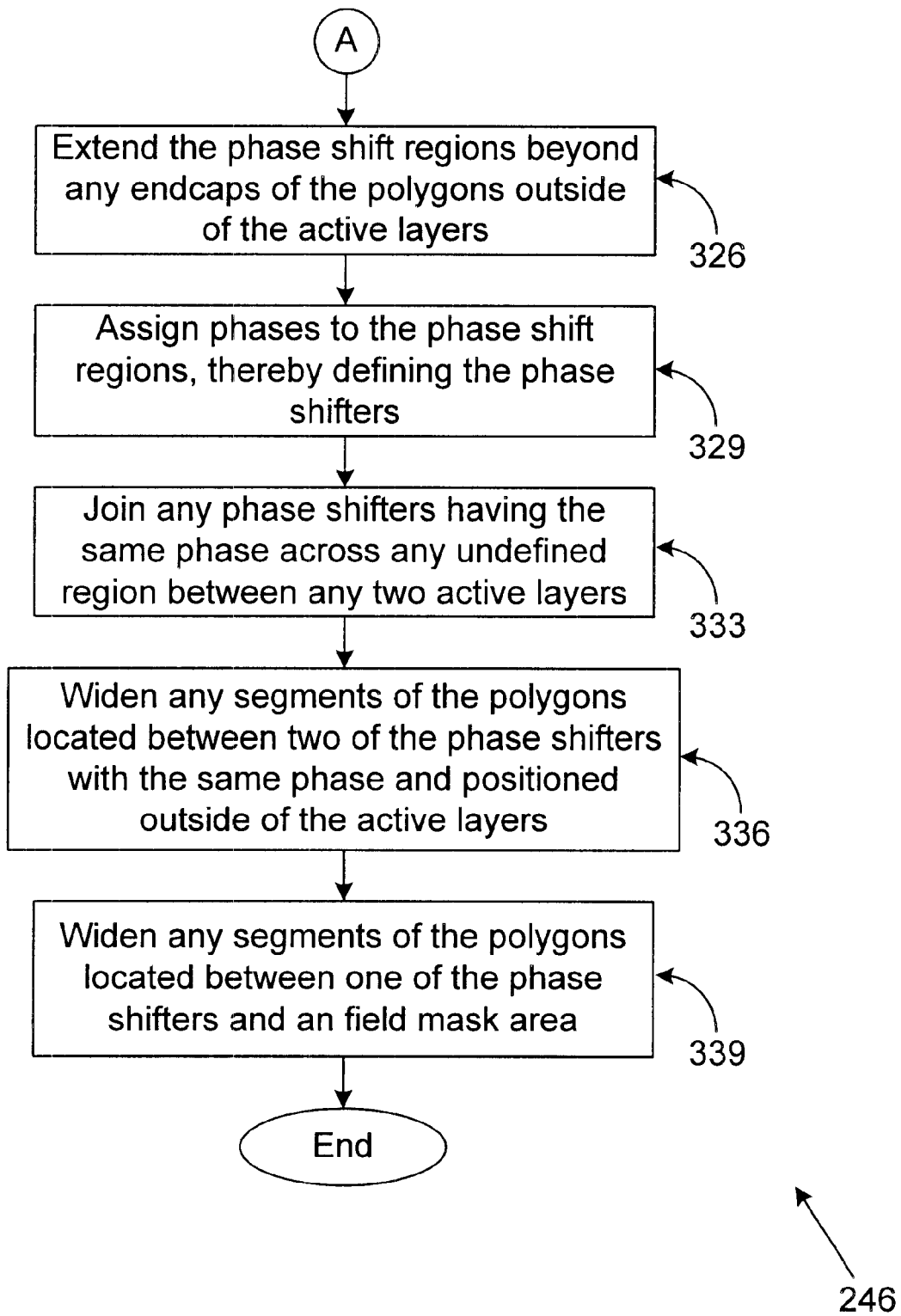

With reference to FIGS. 12A and 12B, shown is a flow chart of the PSM generation logic 246 according to an aspect of the present invention. Alternatively, the flow chart of FIGS. 12A and 12B may be viewed as steps of a method for designing a phase shift mask according to another aspect of the present invention. To begin, the PSM generation logic 246 defines the shape, size, and location of the active regions that correspond with the active regions 103a (FIG. 1) and 103b (FIG. 1). Thereafter, in block 306 the shape, size, and location of the polygons 106a-c (FIG. 1) that represent the active and field polysilicon portion of the integrated circuit to be created are defined. Note that the functions of block 303 and 306 may be skipped by accessing a pre-existing integrated circuit design stored in the memory 206 (FIG. 11) as is generally known by those with ordinary skill in the art.

Next, in block 309 the active gate areas 113 (FIG. 2) are identified as those areas of the polygons 106a-c that overlap with one of the active regions 103a and 103b. Then, in block 313 the edges 123 (FIG. 3) of the active gate areas 113 are identified. Thereafter, in block 316 the straight edges 133 (FIG. 4) of the polygons 106a-c that extend directly from the edges 123 of the active gate areas 113 beyond the active regions 103a and 103b are identified.

In block 319, a number of phase shift regions 146 (FIGS. 5–7) are defined. Specifically, the phase shift regions 146 are defined by creating rectangles that extend from the edges 123 by the predetermined phase width. Also, the edges of the newly created phase shift regions 146 that are perpendicular to the edges 123 are extended just beyond the active regions 103a and 103b. Then, in block 323, the phase shift regions 146 are extended by adding the first phase shift expansions 153 (FIG. 6) that extend along the previously identified straight edges 133. Thereafter, in block 326, the second phase shift expansions 163 (FIG. 7) are added to the phase shift regions 146 beyond any end caps 166 (FIG. 7) of the polygons 106a-c outside of the active regions 103a and 103b.

The PSM generation logic 246 then moves to block 329 in which phases are assigned to the phase shift regions 146, thereby defining the first and second phase shifters 173 (FIG. 8) and 176 (FIG. 8). Next, in block 333, any phase shifters 173, 176 that are associated with different active regions 103a and 103b that also have the same phase and are separated by an undefined region are joined together into a joined phase shifter 183 (FIG. 8). Thereafter, in block 336, any segments of the polygons 106a-c that are located between two of the phase shifters 173, 176 that have an identical phase and are positioned outside of the active regions 103a and 103b are widened. This is done to ensure that these segments are formed properly when the resulting phase shift mask is applied to the integrated circuit in a photo lithographic process to follow.

Finally, in block 339, any segments 196 (FIG. 10) of the polygons 106a-c that are located between one phase shifter 173, 176 and an undefined region that is to be subjected to a field mask are widened to ensure that the polygon is properly formed in such locations. Thereafter, the PSM generation logic 246 ends having defined the phase shift mask with the phase shifters 173 and 176. The phase shift mask may then be constructed using the design generated by the PSM generation logic 246.

The phase masks that are designed according to their present invention provide a distinct advantage in that the field masks that have normally been created to form the polygons 106a-c in areas beyond of the active regions 103a and 103b are unnecessary. Consequently, inaccuracies that may result from using two masks in such a manner are reduced or eliminated.

Although the PSM generation logic 246 of the present invention is embodied in software executed by general purpose hardware as discussed above, as an alternative the PSM generation logic 246 may also be embodied in dedicated hardware or a combination of software/general purpose hardware and dedicated hardware. If embodied in dedicated hardware, the PSM generation logic 246 can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, programmable gate arrays (PGA), field programmable gate arrays (FPGA), or other components, etc. Such technologies are generally well known by those skilled in the art and, consequently, are not described in detail herein.

The flow chart of FIGS. 12A and 12B show the architecture, functionality, and operation of an implementation of the PSM generation logic 246. If embodied in software, each block may represent a module, segment, or portion of code that comprises one or more executable instructions to implement the specified logical function(s). If embodied in hardware, each block may represent a circuit or a number of interconnected circuits to implement the specified logical function(s). Although the flow chart of FIGS. 12A and 12B show a specific order of execution, it is understood that the order of execution may differ from that which is depicted. For example, the order of execution of two or more blocks may be scrambled relative to the order shown. Also, two or more blocks shown in succession in FIGS. 12A and 12B may be executed concurrently or with partial concurrence. It is understood that all such variations are within the scope of the present invention. Also, the flow chart of FIGS. 12A and 12B are relatively self-explanatory and are understood by those with ordinary skill in the art to the extent that software and/or hardware can be created by one with ordinary skill in the art to carry out the various logical functions as described herein.

Also, the PSM generation logic 246 can be embodied in any computer-readable medium for use by or in connection with an instruction execution system such as a computer/processor based system or other system that can fetch or obtain the logic from the computer-readable medium and execute the instructions contained therein. In the context of this document, a "computer-readable medium" can be any medium that can contain, store, or maintain the PSM generation logic 246 for use by or in connection with the instruction execution system. The computer readable medium can comprise any one of many physical media such as, for example, electronic, magnetic, optical, electromagnetic, infrared, or semiconductor media. More specific examples of a suitable computer-readable medium would include, but are not limited to, a portable magnetic computer diskette such as floppy diskettes or hard drives, a random access memory (RAM), a read-only memory (ROM), an erasable programmable read-only memory, or a portable compact disc.

Many variations and modifications may be made to the above-described embodiment(s) of the invention without departing substantially from the spirit and principles of the invention. All such modifications and variations are intended to be included herein within the scope of the present invention.

What is claimed is:

1. A method for generating a phase shift mask, comprising the steps of:

defining a number of phase shift regions that further define a number of active gate areas, wherein each of the active gate areas is associated with one of a number of active regions of a predefined circuit;

defining a number of phase shifters by assigning a phase to each of the phase shift regions; and defining a joined phase shifter by joining at least two of the phase shifters, the at least two phase shifters being associated with different ones of the active regions, the at least two of the phase shifters having a same phase assigned thereto.

2. The method of claim 1, further comprising the step of extending respective ones of the phase shift regions beyond an endcap of at least one polygon adjacent thereto, wherein the at least one polygon is specified in the predefined circuit.

3. The method of claim 1, wherein the step of defining the joined phase shifter further comprises the steps of:

identifying a number of straight edges of a number of polygons that extend directly from a number of respective edges of the active gate areas; and extending the phase shift regions along the straight edges beyond the active regions associated therewith.

4. The method of claim 3, wherein the step of defining the joined phase shifter further comprises the steps of:

identifying a first one of the phase shifters that is associated with a first one of the active regions and a second one of the phase shifters that is associated with a second one of the active regions, wherein the first and second ones of the phase shifters each have a same phase with an undefined region therebetween; and joining the first and second phase shifters across the undefined region, thereby defining the joined phase shifter.

5. The method of claim 3, further comprising the step of widening a segment of one of the polygons.

6. The method of claim 5, further comprising the step of identifying the segment by locating a portion of one of the polygons beyond the active regions and positioned between two of the phase shifters having the same phase.

7. The method of claim 5, further comprising the step of identifying the segment by locating a portion of one of the polygons beyond the active regions and positioned between one of the phase shifters and an undefined region.

8. A phase shift mask, comprising:

a number of phase shifters that define a number of active gate areas, wherein each of the active gate areas is associated with one of a number of active regions of a predefined circuit;

at least one joined phase shifter defining at least two of the active gate areas, the at least one joined phase shifter extending between at least two of the active regions.

9. The phase shift mask of claim 8, wherein the phase shifters extend beyond an endcap of at least one of a number of polygons.

10. The phase shift mask of claim 8, wherein a phase is assigned to each of the phase shifters.

11. The phase shift mask of claim 8, further comprising a number of polygons at least partially defined by the phase shifters, the polygons having a first segment located between two of the phase shifters having a same phase and a second segment located between two of the phase shifters with a different phase, wherein the first segment is wider than the second segment.

12. The phase shift mask of claim 11, wherein selected ones of the polygons further comprise a third segment located between one of the phase shifters and an undefined region, wherein the third segment is wider than the second segment.

13. A method for generating a phase shift mask, comprising the steps of:

defining a number of phase shifters that further define a number of active gate areas, wherein each of the active gate areas is associated with one of a number of active regions of a predefined circuit; and defining at least one joined phase shifter that defines at least two of the active gate areas, the at least one joined phase shifter extending between at least two of the active regions.

14. The method of claim 13, wherein the step of defining the at least one joined phase shifter further comprises the steps of:

identifying a number of straight edges of a number of polygons that extend directly from a number of respective edges of the active gate areas; and extending the phase shifters along the straight edges beyond the active regions associated therewith.

15. The method of claim 14, further comprising the step of:

assigning a phase to each phase shifter.

16. The method of claim 15, wherein the step of defining the at least one joined phase shifter further comprises the steps of:

identifying a first one of the phase shifters that is associated with a first one of the active regions and a second one of the phase shifters that is associated with a second one of the active regions, wherein the first and second ones of the phase shifters each have a same phase with an undefined region therebetween; and joining the first and second phase shifters across the undefined region, thereby defining the joined phase shifter.

17. The method of claim 15, further comprising the step of widening a segment of one of the polygons.

18. The method of claim 17, further comprising the step of identifying the segment by locating a portion of one of the polygons beyond the active regions and positioned between two of the phase shifters having the same phase.

19. The method of claim 17, further comprising the step of identifying the segment by locating a portion of one of the polygons beyond the active regions and positioned between one of the phase shifters and an undefined region.

20. The method of claim 13, further comprising the step of extending respective ones of the phase shifters beyond an endcap of at least one polygon adjacent thereto, wherein the at least one polygon is specified in the predefined circuit.

* * * * *